United States Patent
Peng et al.

(10) Patent No.: US 7,823,747 B2
(45) Date of Patent: Nov. 2, 2010

(54) CASING WITH FLIP COVER

(75) Inventors: Yao-Che Peng, Guangdong (CN); Jung-Chang Tai, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 986 days.

(21) Appl. No.: 11/613,198

(22) Filed: Dec. 20, 2006

(65) Prior Publication Data

US 2007/0267428 A1 Nov. 22, 2007

(30) Foreign Application Priority Data

Apr. 28, 2006 (CN) .......................... 2006 1 0060524

(51) Int. Cl.
B65D 43/16 (2006.01)
B65D 43/24 (2006.01)
B65D 43/22 (2006.01)

(52) U.S. Cl. ..................... 220/835; 16/347; 16/337; 220/4.22; 220/831

(58) Field of Classification Search .............. 220/835, 220/827, 4.22, 831, 841; 16/342, 348, 358, 16/361, 347, 337, 339

See application file for complete search history.

(56) References Cited

U.S. PATENT DOCUMENTS

| | | | | |
|---|---|---|---|---|
| 1,195,085 A | * | 8/1916 | Raber ........................... 16/274 |
| 4,239,093 A | * | 12/1980 | Eubanks et al. .............. 190/106 |
| 4,253,568 A | * | 3/1981 | Long et al. ................ 206/387.1 |
| 4,356,594 A | | 11/1982 | Grosemans |
| 4,562,566 A | | 12/1985 | Eisemann |
| 5,050,270 A | * | 9/1991 | Burgei et al. .................. 16/298 |
| 5,121,521 A | * | 6/1992 | Hagiwara et al. ............. 16/278 |
| 5,341,357 A | | 8/1994 | Mukawa et al. |
| 5,413,317 A | * | 5/1995 | Spoerre ...................... 267/134 |
| 6,128,265 A | | 10/2000 | Leung |
| 6,470,532 B2 | * | 10/2002 | Rude ........................... 16/335 |
| 6,626,287 B1 | * | 9/2003 | Watson ......................... 206/6 |
| 6,883,680 B2 | * | 4/2005 | Hirose ......................... 220/830 |
| 6,986,434 B1 | * | 1/2006 | Getsy et al. .............. 220/254.3 |
| 2003/0071047 A1 | * | 4/2003 | Harada ....................... 220/835 |
| 2005/0077308 A1 | * | 4/2005 | Ishii .......................... 220/830 |
| 2005/0229195 A1 | | 10/2005 | Liu |
| 2006/0026613 A1 | | 2/2006 | Mao |
| 2006/0288532 A1 | * | 12/2006 | Kim, II ........................ 16/267 |

* cited by examiner

*Primary Examiner*—Anthony Stashick
*Assistant Examiner*—Niki M Eloshway
(74) *Attorney, Agent, or Firm*—Winston Hsu; Scott Margo; Min-Lee Teng

(57) ABSTRACT

A casing includes a base, a flip cover pivotably attached to the base, a first member fixed to the flip cover, and a second member fixed to the base. The flip cover is rotatable around an axis of rotation with respect to the base. The first member forms a tip toward the base along a direction perpendicular to the axis of rotation. The second member extends an elongated arm, the elongated arm being crushed by the tip of the first member in an opening process of the flip cover with respect to the base so as to block the flip cover from opening with a rush.

18 Claims, 6 Drawing Sheets

US 7,823,747 B2

CASING WITH FLIP COVER

BACKGROUND OF THE INVENTION

1. Field of the Invention

The present invention generally relates to casings, and more particularly, to a casing with a flip cover.

2. Description of Related Art

Most electronic devices have releasable casings. That is, each of the casings includes a base and a flip cover releasable from the base. The flip cover is applied by an external force to flip-open relative to the base. A torsion spring or the like is utilized to apply a force to open the flip cover.

However, the flip cover is prone to ricocheting/wobbling back and forth when reaching a largest opening angle. It is because that the flip cover is opened with a rush and cannot be properly positioned and stabilized.

Accordingly, a need exists for a casing with a flip cover resolving the above problem in the industry.

SUMMARY OF THE INVENTION

According to one aspect, a casing includes a base, a flip cover pivotably attached to the base, a first member fixed to the flip cover, and a second member fixed to the base. The flip cover is rotatable around an axis of rotation with respect to the base. The first member forms a tip toward the base along a direction perpendicular to the axis of rotation. The second member extends an elongated arm, the elongated arm being crushed by the tip of the first member in an opening process of the flip cover with respect to the base so as to block the flip cover from opening with a rush.

According to another aspect, a casing includes a base, a lid pivotably attached to the base, a first member attached to the lid, and a second member attached to the base. The lid is rotatable around a axis of rotation to open or close the lid with respect to the base. The first member and the second member are attached next to the axis of rotation. The first member extends a tip, and the second member extends an elongated arm. The elongated arm interfered by the tip of the first member to damp down the lid when opening.

Other systems, methods, features, and advantages of the present casing will be or become apparent to one with skill in the art upon examination of the following drawings and detailed description. It is intended that all such additional systems, methods, features, and advantages be included within this description, be within the scope of the present apparatus, and be protected by the accompanying claims.

BRIEF DESCRIPTION OF THE DRAWINGS

Many aspects of the present casing can be better understood with reference to the following drawings. The components in the drawings are not necessarily drawn to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe the preferred embodiments of the present casing, in detail.

Figure 1:
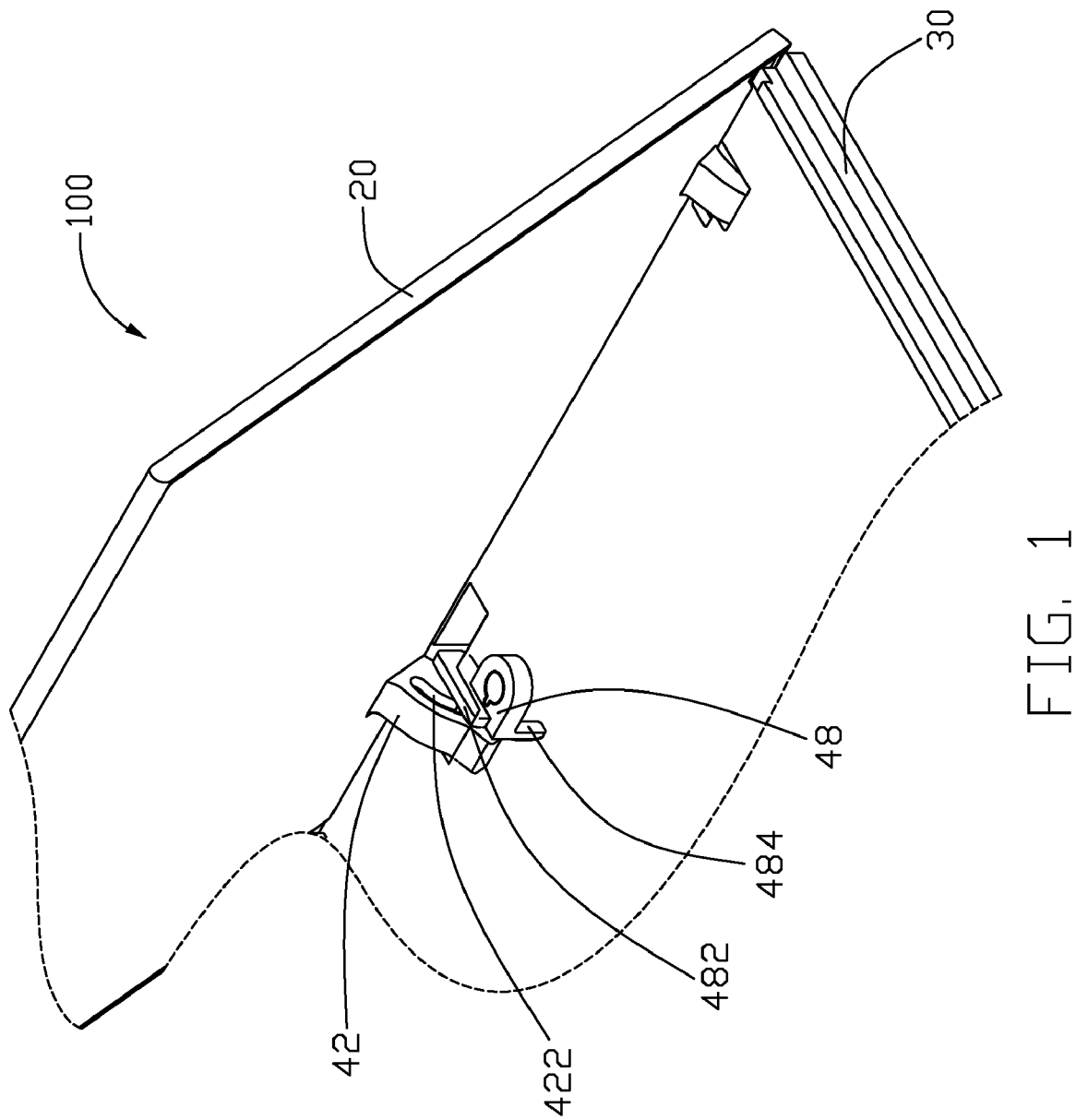
FIG. 1 is an isometric view of a casing in accordance with a first exemplary embodiment, the casing including a first member and a second member.

Referring to FIG. 1, a casing 100 in accordance with a first embodiment is illustrated. The casing 100 includes a flip cover 20 and a base 30. The flip cover 20 is pivotably attached to the base 30 along an axis of rotation so as to be openable or closable with respect to the base 30. A first member 42 is formed on the flip cover 20 near the axis of rotation. A second member 48 is fixed to the base 30. The first member 42 and the second member 48 engages with each other while the flip cover 20 is rotated and positioned, thus, guiding the flip cover 20 to reach a predetermined opening angle.

Figure 2:
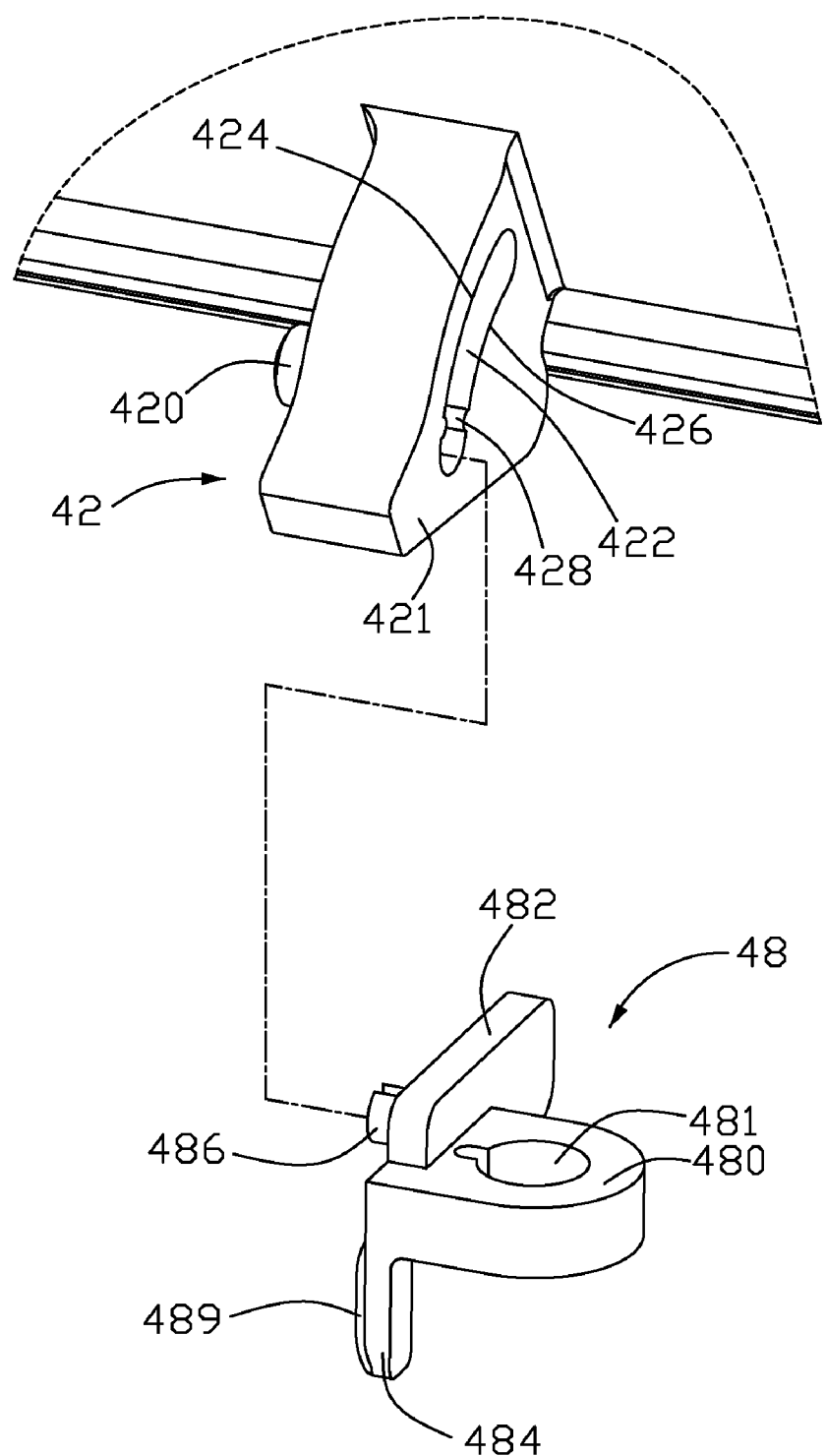
FIG. 2 is an exploded view of the first member and the second member.

Referring to FIG. 2, the first member 42 is in a rough quadrant shape with a tip 421 extending outwards from a corner of the first member 42 toward the base 30. A shaft 420 extends from the first member 42 along the axis of rotation, and is inserted into the base 30, thus, pivoting the flip cover 20 on the base 30 and allowing the flip cover 20 to rotate around the shaft 420 with respect to the base 30. The first member 42 defines a guiding channel 422 that arcs around the axis of rotation. The guiding channel 422 is bounded by a first cambered surface 424 and a second cambered surface 426. The first and second cambered surfaces 424, 426 are coaxial with a radii of the first cambered surface 424 greater than a radii of the second cambered surface 426 Each of the first cambered surface 424 and the second cambered surface 426 forms a raised ridge 428 thereon. The raised ridges 428 of the first cambered surface 424 and the second cambered surface 426 face each other. Therefore, a distance between the first cambered surface 424 and the second cambered surface 426, i.e. a width of the guiding channel 422, is greater than a distance between the raised ridges 428 of the first cambered surface 424 and the second cambered surface 426. The raised ridges 428 are disposed near an end of the guiding channel 422, i.e., the end furthest away from the flip cover 20.

Figure 3:
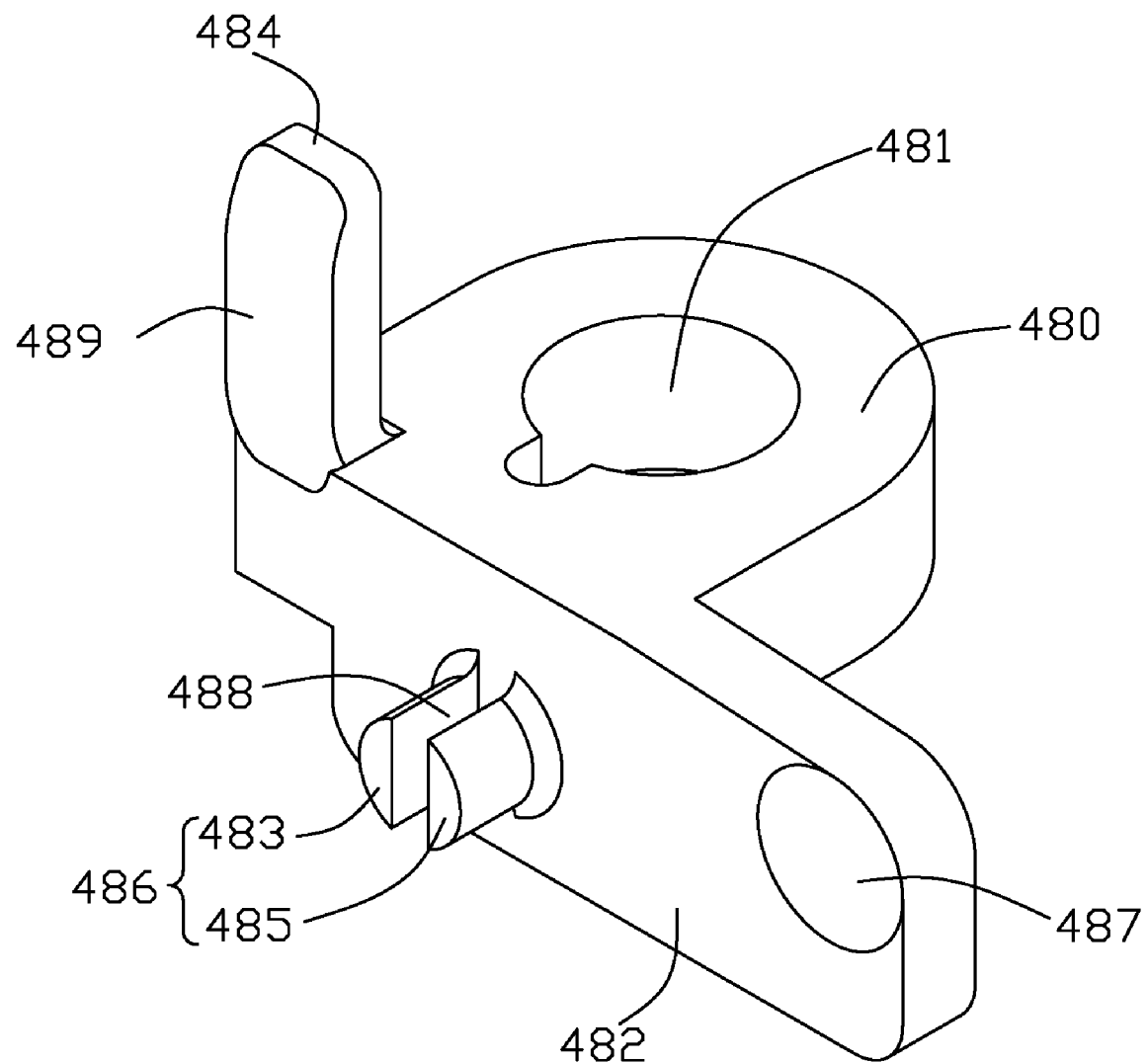
FIG. 3 is an enlarged view the second member, but viewed from another aspect.

Referring to FIG. 3 together, the second member 48 includes a main body 480, an extending plate 482, and an elongated arm 484. The extending plate 482 and the elongated arm 484 extend from an edge of the main body 480 along two perpendicular directions. The extending plate 482 engages with the first member 42 to guide the flip cover 20. The elongated arm 484 is interfered by the first member 42 to decelerate a speed and dampen vibrations of the flip cover 20 while opening flip cover 20. The elongated arm 484 is slightly deformable toward a direction parallel to the axis of rotation when interfered by with the tip 421 of the first member.

Figure 4:
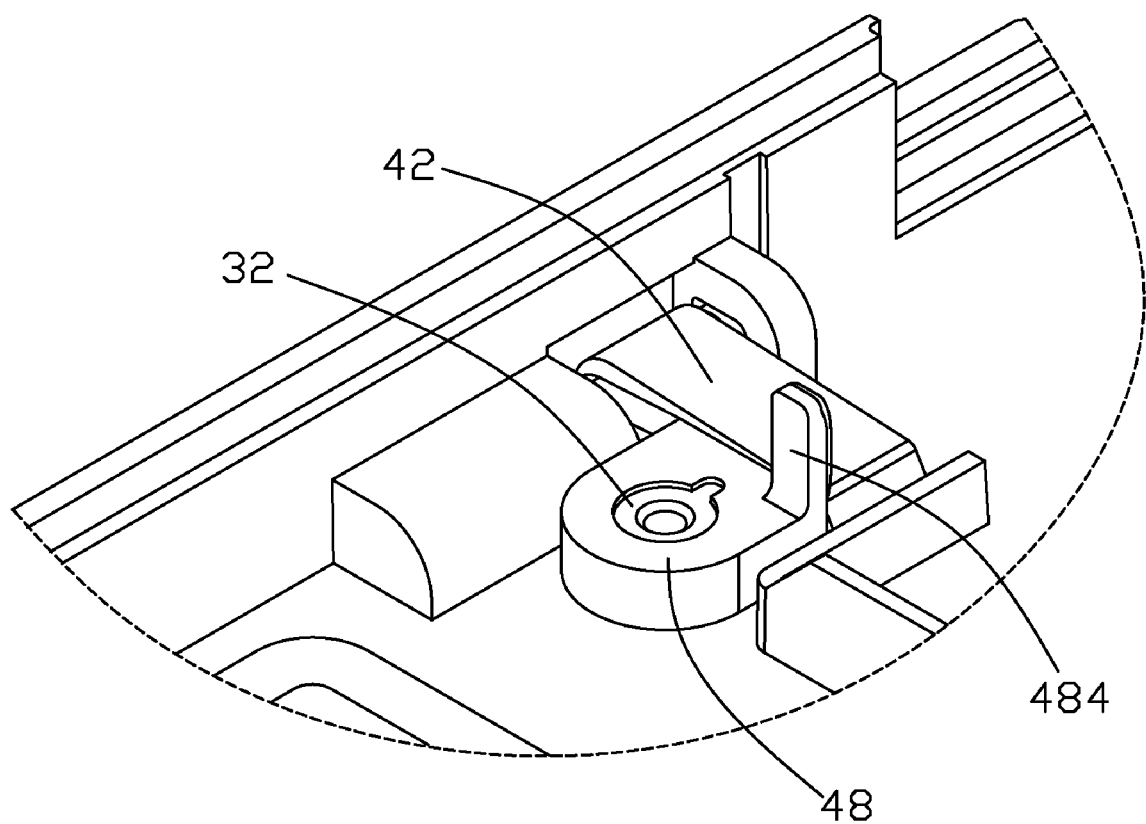
FIG. 4 is an assembled view of the casing from an inverted aspect.

A mounting hole 481 is defined in a center of the main body 480. The mounting hole 481 is configured corresponding to a shape of the positioning pin 34. The shape of the mounting hole 481 and the shape of the positioning pin 32 is constructed in such away that the second member 48 is unable to spin around the position pin 32. Referring to FIG. 4, the second member 48 is disposed on the base 30 with the second member 48 sleeved on a positioning pin 32 of the base 30, thus, securing the second member 48 to the base 30.

A contacting protrusion 487 protrudes from the extending plate 482. The contacting protrusion 487 is in contact with the first member 42, defining a contact point on the axis of rotation of the flip cover 20 between the first member 42 and second member 48. A split knob 486 extends from the extending plate 482 towards the guiding channel 422 of the first member 42. A diameter of the split knob 486 is smaller than the width of the guiding channel 422, and is greater than a distance between the raised ridges 428. That is, the diameter of the split knob 486 is configured to be between the width of the guiding channel 42 and the distance of the raised ridges 428. The split knob 486 is received in the guiding channel 422 so as to guide the flip cover 20 in the opening process of the flip cover 20. The split knob 486 is divided into a first portion 483 and a second portion 485 by a split 488 defined along an extended diameter thereof. The first portion 483 and the second portion 485 are elastically deformable to converge toward the split 488 so the split knob 486 can pass through the raised ridges 428 in the guiding channel 422.

The elongated arm 482 includes a convex curved surface 489 that protrudes toward the first member 42. The curved surface 489 is interfered by the tip 421 of the first member 42, decreasing the angular velocity of the flip cover 20 so as to eliminate wobbles/reverberates of the flip cover 20 in the opening process.

When opening, the flip cover 20 is released under a releasing force, applied by, for example, a torsion spring. The flip cover 20 flips open from the base 3 relative to the axis of rotation. The first member 48 rotates together with the flip cover 20, causing the guiding channel 422 of the first member to slide around the split knob 486 that is held stationary and causing the curved surface of the elongated arm 484 to rub/interfere against the tip 421 of the first member that is rotating. The angular velocity of the flip cover 20 with respect to the base 30 is thus decreased due to a force applied by the elongated arm 426 on the first member 42, thus, eliminating/depressing wobbles thereof. As the flip cover 20 opens toward the largest opening angle, the split knob 486 reaches the raised ridges 428 in the guiding channel 422. The first portion 483 and the second portion 485 deform and converge toward the split 488 so that the split knob 486 is able to squeeze through the raised ridges 428, reaching the largest opening angle. When the flip cover 20 reaches the largest opening angle, the split knob 486 is supported by the raised ridges 428, thus, holding the flip cover 20 in position and stabilizing flip cover 20 at the largest opening angle.

When closing, an external force is applied to the flip cover 20, and the raised ridges 428 force the split knob 486 to be deformed getting therethrough. Subsequently, the flip cover 20 continues closing with the guiding channel 422 sliding around the split knob, until the flip cover reaches the base 30 as a result.

Figure 5:
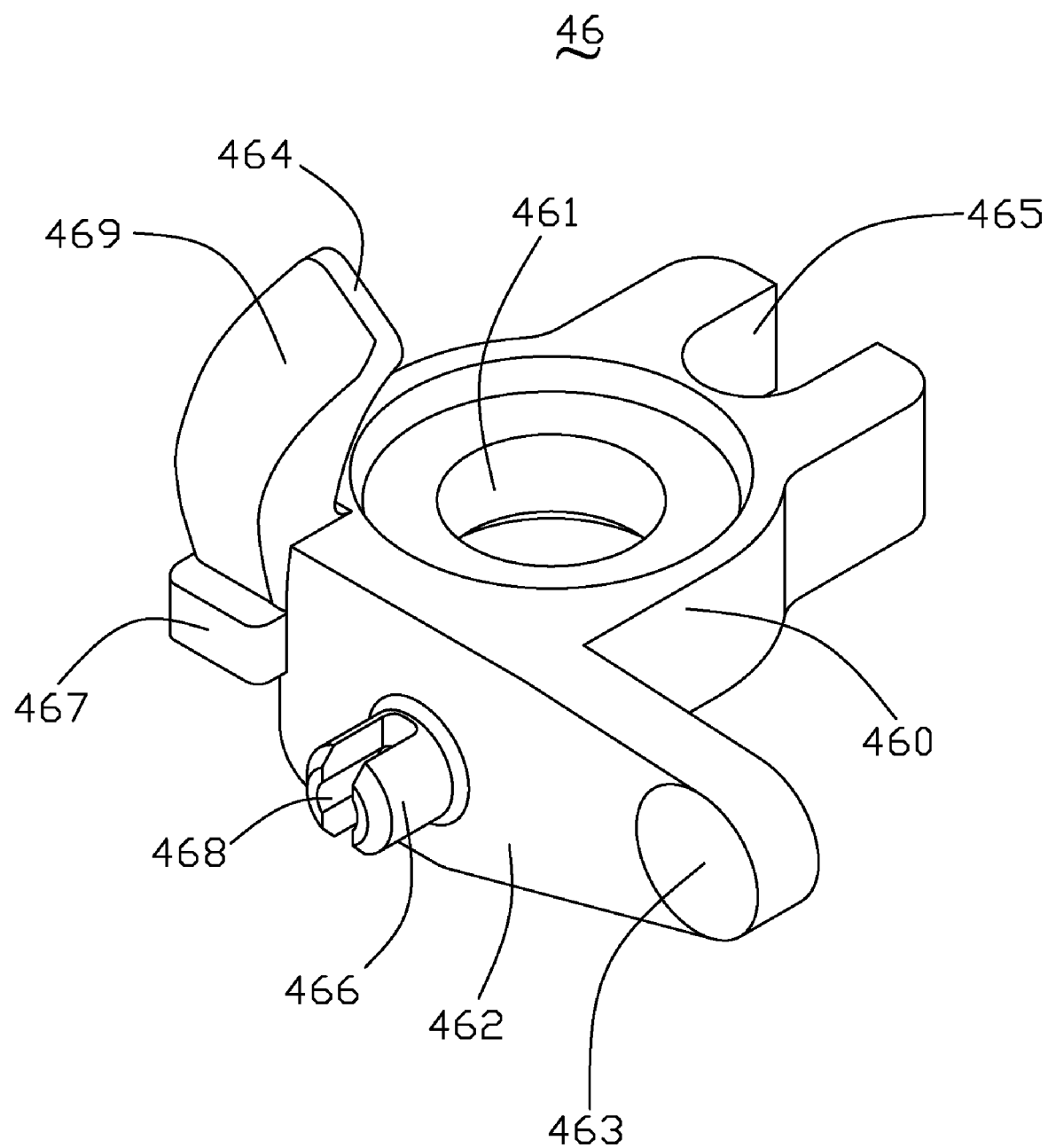
FIG. 5 is a second member in accordance with a second embodiment.
Figure 6:
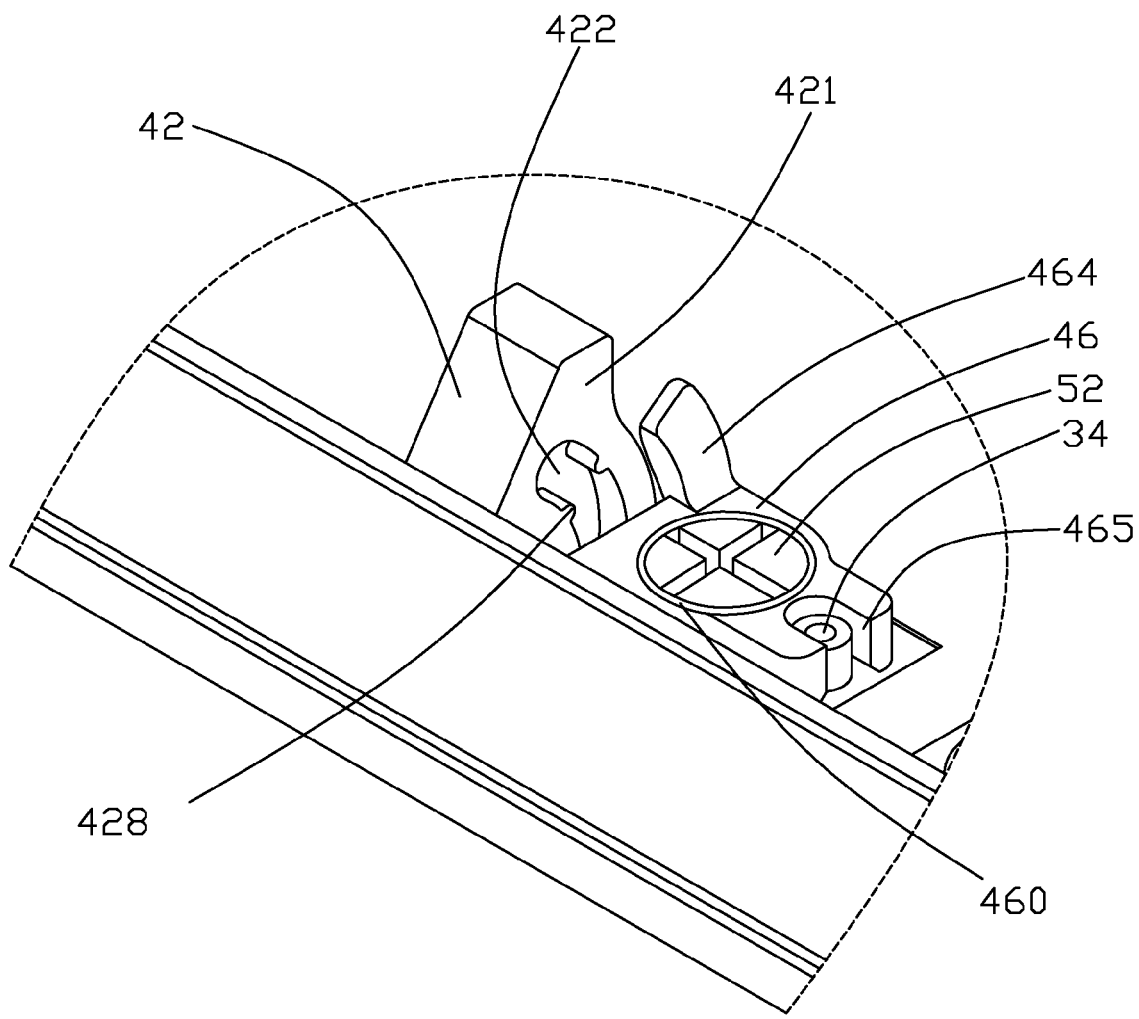
FIG. 6 is an assembled view of a casing in accordance with a second exemplary embodiment with the second member in FIG. 5 from an inverted aspect.

Referring to FIG. 5 and FIG. 6, a second member 46 in accordance with a second embodiment is illustrated. The second member 46 includes a main body 460, an extending plate 462, and an elongated arm 464.

The main body 460 defines a central hole 461 at a center and a cutout 465 at a side. The second member 46 is secured to the base 30 by a screw 52 through the central hole 461. A positioning pin 34 formed on the base 30 is received in the cutout 465 to position the second member 46 and to prevent it from drifting.

The extending plate 462 includes a contacting protrusion 463 and an split knob 466. The contacting protrusion 463 resists against the first member 42 of the flip cover 20 to define a contact point therebetween on the axis of rotation. The split knob 466 is similar to the split knob 486 in the first embodiment, but defines a round hole 468 to make a wall thickness of the split knob 468 uniform and to increase an elasticity of the split knob.

The elongated arm 464 is bended around the axis of rotation of the flip cover 20 to increase interference with the first member 42. The elongated arm 464 includes a curved surface 469 interfering with the tip 421 of the first member 42 to decelerate the flip cover 20 in the opening process. A baffle 467 extends along a direction parallel to the axis of rotation toward the first member 42, and resists against the tip 421 to prevent the flip cover 20 from over-opening (i.e. opening to an angle greater . . . ) and to protect the split knob 466 when the flip cover 20 reaches the largest opening angle.

In the above embodiments, the second members 48, 46 are preferred to be made of self-lubricating material, for example polyformaldehyde material. Polyoxymethylene is a kind of superior self-lubricating material with high abradability. It greatly enhances a performance of the second members 48, 46. The split knobs 486, 466 slide in the guiding channel 422, and resist against the raised ridges 428 therein. The flip cover 20 rotates steadily along the guiding channel 422 when opening, and is stabilized when reaching the largest opening angle.

Some modifications, such as omitting one of the raised ridges 428, the split knobs 486, 466 being a hollow tube shape, et. al, can be made to the above embodiments.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A casing, comprising:
    a base;
    a flip cover pivotably attached to the base, the flip cover being rotatable around an axis of rotation with respect to the base;
    a first member fixed to the flip cover next to the axis of rotation, the first member forming a tip toward the base along a direction perpendicular to the axis of rotation; and
    a second member fixed to the base next to the axis of rotation, the second member extending an elongated arm, the elongated arm being crushed by the tip of the first member and slightly deformed along a direction parallel to the axis of rotation in an opening process of the flip cover with respect to the base so as to block the flip cover from opening with a rush.

2. The casing as claimed in claim 1, wherein the elongated arm comprises a convex curved surface contacting with the tip of the first member in the opening process.

3. The casing as claimed in claim 1, wherein the elongated arm is bent around the axis of rotation of the flip cover.

4. The casing as claimed in claim 1, wherein the second member forms a contacting protrusion toward the first member, and the contacting protrusion contacts with the first member to define the axis of rotation of the flip cover.

5. The casing as claimed in claim 1, wherein the first member defines a guiding channel around the axis of rotation, and the second member forms a knob slidably received in the guiding channel to guide movement of the flip cover.

6. The casing as claimed in claim 5 wherein the first member forms a pair of raised ridges extending into the channel to narrow a width of the channel adjacent an end thereof.

7. The casing as claimed in claim 6 wherein the knob is elastically deformable to get through a part of the guiding channel where the raised ridges lies, and is restorable to prevent from getting through the part of the guiding channel where the raised ridges lies when reaching the end of the guiding channel.

8. The casing as claimed in claim 7 wherein the knob is divided into a first portion and a second portion, and the first portion and the second portion are deformable toward each other.

9. The casing as claimed in claim 7 wherein a baffle extends from the second member along direction parallel to the axis of rotation toward the first member, and the baffle resists against the tip to prevent the flip cover from over-opening in the opening.

10. A casing, comprising:
a base;
a lid pivotably attached to the base, the lid being rotatable around an axis of rotation to open or close the lid with respect to the base;
a first member attached to the lid next to the axis of rotation of the lid, the first member extending a tip; and
a second member attached to the base, the second member extending an elongated arm, the elongated arm interfering with the tip of the first member to damp down the lid when opening, the elongated arm being slightly deformable toward a direction parallel to the axis of rotation when interfering with the tip of the first member.

11. The casing as claimed in claim 10 wherein the elongated arm comprises a convex curved surface contactable with the tip of the first member.

12. The casing as claimed in claim 10 wherein the elongated arm is bent around the axis of rotation of the lid.

13. The casing as claimed in claim 10 wherein the first member is in a substantial quadrant shape.

14. The casing as claimed in claim 13 wherein the tip extends from the first member along a direction perpendicular to the axis of rotation of the lid.

15. The casing as claimed in claim 14 wherein the tip extends from an edge of the first member along a radial direction thereof.

16. The casing as claimed in claim 10 wherein the second member forms a convex contacting protrusion toward the first member, and the contacting protrusion contacts with the first member to define the axis of rotation.

17. The casing as claimed in claim 10 wherein the first member defines a guiding channel around the axis of rotation, and the second member forms a knob slidably received in the guiding channel to guide movement of the flip cover.

18. The casing as claimed in claim 17 wherein the first member forms a pair of raised ridges extending into the channel to narrow a width of the channel adjacent an end thereof, the knob is divided by a split into a first portion and a second portion deformable toward each other, the knob is elastically deformable to get through a part of the guiding channel where the raised ridges lies, and is restorable to prevent from getting through the part of the guiding channel where the raised ridges lies when reaching the end of the guiding channel.

* * * * *